United States Patent [19]

Nakagawa et al.

[11] Patent Number: 4,742,239

[45] Date of Patent: May 3, 1988

[54] LINE PHOTOSENSOR WITH CROSSTALK SUPPRESSION

[75] Inventors: Katsumi Nakagawa, Kawasaki; Toshiyuki Komatsu, Yamato; Masaki Fukaya, Yokohama; Hirofumi Iwamoto, Machida; Shinichi Seito, Atsugi, all of Japan

[73] Assignee: Canon Kabushiki Kaisha, Tokyo, Japan

[21] Appl. No.: 842,270

[22] Filed: Mar. 21, 1986

[30] Foreign Application Priority Data

Mar. 25, 1985 [JP] Japan ................... 60-058521

[51] Int. Cl.⁴ ........................................... H01L 27/14
[52] U.S. Cl. ..................................... 250/578; 357/30
[58] Field of Search ............... 250/578, 211 R, 211 J; 357/30, 51, 71 R, 84, 30 Q, 30 H, '30 D, 30 K; 358/212, 213

[56] References Cited

U.S. PATENT DOCUMENTS 4,471,371  9/1984  Hamano ................... 357/30
4,475,118 10/1984  Klein et al. ............... 357/51
4,622,432 11/1986  Yamazaki ................. 357/30

Primary Examiner—Edward P. Westin
Assistant Examiner—Charles Wieland
Attorney, Agent, or Firm—Fitzpatrick, Cella, Harper & Scinto

[57] ABSTRACT

A line photosensor comprising a plurality of sensor elements in at least one row on a substrate and a plurality of extract wiring electrodes extending from the respective sensor elements. The extract wiring electrodes are wired in an electrically isolated and laminated manner. The extract wiring electrodes are laminated such that they hold therebetween a laminated structure including a first insulating layer, an intermediate electrode layer formed on the first insulating layer, and a second insulating layer formed on the intermediate electrode layer.

4 Claims, 4 Drawing Sheets

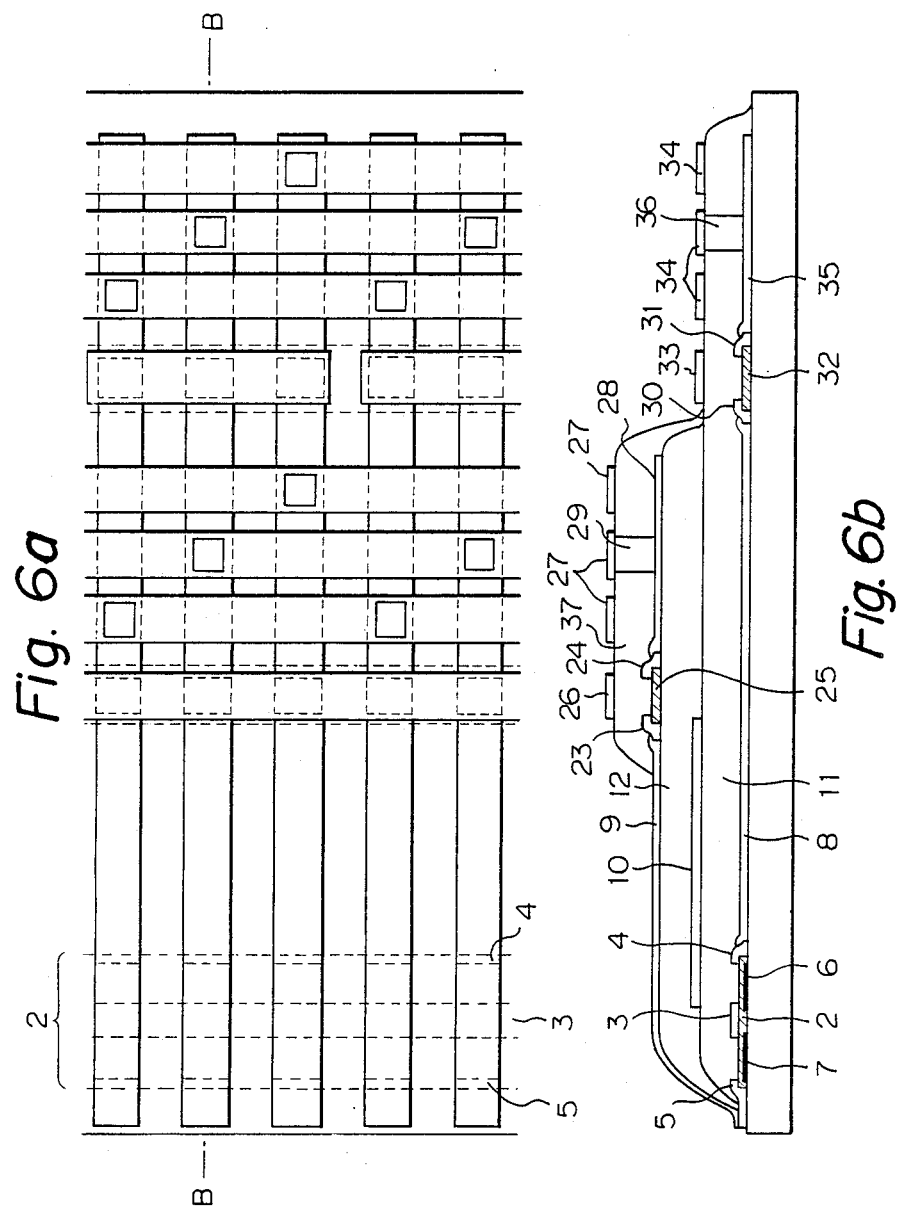

4,742,239

LINE PHOTOSENSOR WITH CROSSTALK SUPPRESSION

BACKGROUND OF THE INVENTION

(1) Field of the Invention

The present invention relates to line photosensor and particularly line photosensors in which a plurality of sensor elements are disposed in a row or rows on the same substrate and the respective output leads from the sensor elements are wired in an electrically isolated and laminated manner.

(2) Related Background Art

With the recent advancement of image processing techniques, facsimile devices have generally spread rapidly. Also, digital reproduction devices and input image readers for personal computers have been developed. In such a device, to be able to input an image as digital quantities requires an image sensor, a so-called line photosensor, which reads an image by scanning the same electrically in one direction and mechanically in the transverse direction. The most prevailing line photosensor is of a CCD type. In order to miniaturize the entire device, the development of a contact type reading sensor has been expedited, including a short-optical path self-focusing fiber array (Nihon Sheet Glass "SELFOC" (trade name)) having a length equal to at least the width of a document to be read. The reading sensor normally has no self-scan function to output image information externally from the respective sensor elements and requires the provision of an additional scan circuit therefor. In this case, output leads are needed for the respective sensor elements between these elements and the scan circuit. When an increase in the number of sensor elements is required as in the case of high-precision reading or color reading, the respective leads should be very thin and occurrence of lead disconnections and/or shortcircuits between adjoining leads cannot be prevented. In order to solve this problem, for example, a line photosensor having a laminated structure as shown in FIG. 1 has been proposed in the past. FIG. 1(a) is a plan view of the photosensor and FIG. 1(b) is a cross-sectional view taken along the line A-A of FIG. 1(a).

Reference numeral 1 denotes a glass substrate on which a photoconductor 2, for example, of amorphous silicon, is formed. Attached to photoconductor 2 are a common electrode 3 and individual electrodes 4 and 5, to form two coplanar sensor elements. Different-color filters 6 and 7 are disposed between the respective sensor elements and the substrate, and the respective sensor elements are formed so as to be sensitive to different colors. An insulating layer 38 is provided between the extract wiring electrodes 8 and 9. Electrodes 8 and 9 are connected by junction leads 43 and 44 to corresponding drive ICs 13 and 14, respectively. This arrangement has an advantage that it can prevent the extract wiring electrodes 8 and 9 from being excessively thin and facilitate wiring between the ICs and the respective sensor elements. If there is a voltage difference between the extract wiring electrodes 8 and 9, however, the two corresponding sensor element outputs will effect each other.

On the other hand, if a method of storing the photocurrent from each sensor element for a fixed duration is employed as the method of driving the sensor element, and particularly if the sensor is a photoconductive type line photosensor which allows a large current to flow therethrough, a photocurrent storage capacitor is needed for each sensor element. In this case, as shown in FIG. 2, the extract wiring electrodes 9 and 10 are provided at the corresponding ends of substrate 1, grounding electrodes 41 and 42 are provided by the medium of insulating layers 39 and 40 under the electrodes 9 and 10, respectively, so that each set of electrode 9, insulating layer 39 and grounding electrode 41 constitutes one capacitor while a corresponding set of the electrode 10, insulating layer 40 and grounding electrode 42 constitutes the other capacitor. Since this type of line photosensor has the extract wiring electrodes 9 and 10 at the corresponding ends of the substrate, the desired degree of miniaturization cannot be attained. Also, each of the extract electrodes 9 and 10 is used as one electrode of the corresponding capacitor. Thus if the length of each electrode is shortened to miniaturize the entire line sensor, the electrode areas, and hence capacity of a capacitor, will be reduced.

SUMMARY OF THE INVENTION

In view of the above prior art problems, an object of the present invention is to provide a miniaturized line photosensor which reduces the mutual influence between the extract wiring electrodes and attains a high-density structure.

Another object of the present invention is to provide a line photosensor comprising a plurality of sensor elements disposed in at least one row on a substrate and extract wiring electrodes extending from the respective sensor elements, the electrodes being wired in an electrically isolated and laminated manner in which the extract wiring electrodes are laminated such that they hold therebetween a laminated structure including a first insulating layer, an intermediate electrode layer formed on the first insulating layer and a second insulating layer formed on the intermediate electrode layer.

BRIEF DESCRIPTION OF THE DRAWINGS

FIG. 1, comprising FIGS. 1(a) and 1(b), illustrates a schematic structure of a prior art laminated-structured type line photosensor in which FIG. 1(a) is a plan view of the photosensor and FIG. 1(b) is a cross-sectional view taken along the line A-A' of FIG. 1;

FIG. 6, comprising FIGS. 6(a) and 6(b) illustrates a schematic structure of a combination of a matrix circuit and the line photosensors having the structure of the first embodiment of FIG. 3, FIG. 6(a) being a plan view of the combination and FIG. 6(b) a cross-sectional view taken along the line B-B' of FIG. 6(a).

DETAILED DESCRIPTION OF THE PREFERRED EMBODIMENTS

Embodiments of the present invention will now be described with reference to the drawings.

Figure 1A:
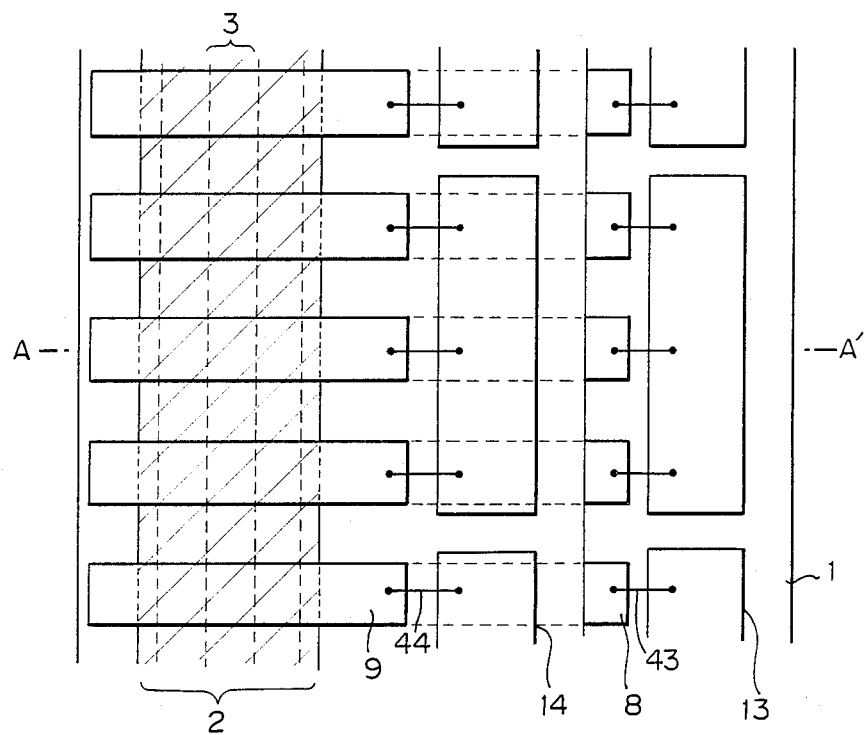
Figure 1B:
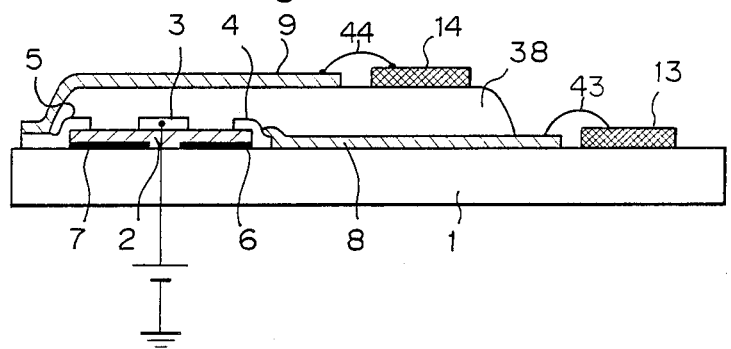
Figure 2:
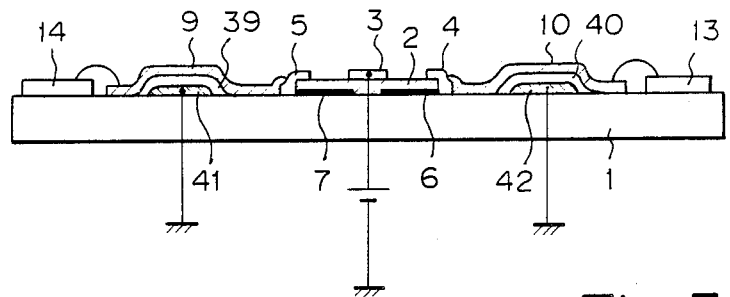
FIG. 2 illustrates a schematic structure of a prior art line photosensor with a photocurrent storage capacitor.
Figure 3:
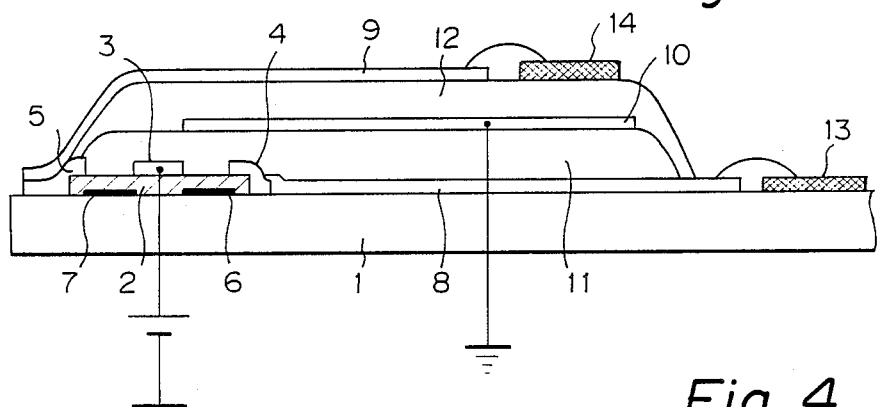
FIG. 3 illustrates a schematic coplanar structure of a first embodiment of a line photosensor according to the present invention.

FIG. 3 is a schematic cross-sectional view of a line photosensor which is a first embodiment according to the present invention. In FIG. 3, a parts similar to those of FIGS. 1 and 2 are given the same reference numerals as these for the corresponding parts of FIGS. 1 and 2.

In FIG. 3, reference numeral 1 denotes a glass substrate on which a photoconductor 2, for example, of amorphous silicon is deposited. Attached to photoconductor 2 are a common electrode 3 and individual electrodes 4 and 5, thereby defining two coplanar type sensor elements. Different-color filters 6 and 7 are disposed between the corresponding sensor elements and the glass substrate. Thus the respective sensor elements are formed so as to be sensitive to different colors. Individual electrodes 4 are connected to the corresponding sensor element driver IC 13 by extract wiring electrode 8. Formed on the electrodes 8 and photoconductor 2 is an insulating layer 11 on which grounding electrodes 10 are formed opposite to the extract wiring electrodes 8 to form corresponding capacitors c1. Formed on grounding electrodes 10 is an insulating layer 12 on which the extract wiring electrodes 9 are formed opposite to grounding electrodes 10 thereby to form corresponding capacitors c2. Individual electrodes 5 are connected to corresponding IC 14 by the extract wiring electrode 9. Thus formed capacitors c1 and c2 allow photocurrents to be stored. Since grounding electrode 10 is formed between the extract electordes 8 and 9, there is no mutual influence between the two sensor elements due to the extract electrodes 8 and 9. In addition, since grounding electrode 10 is shared by the grounding electrodes of capacitors c1 and c2, and capacitors c1 and c2 each have a laminated structure, the wiring areas are greatly reduced.

Figure 4:
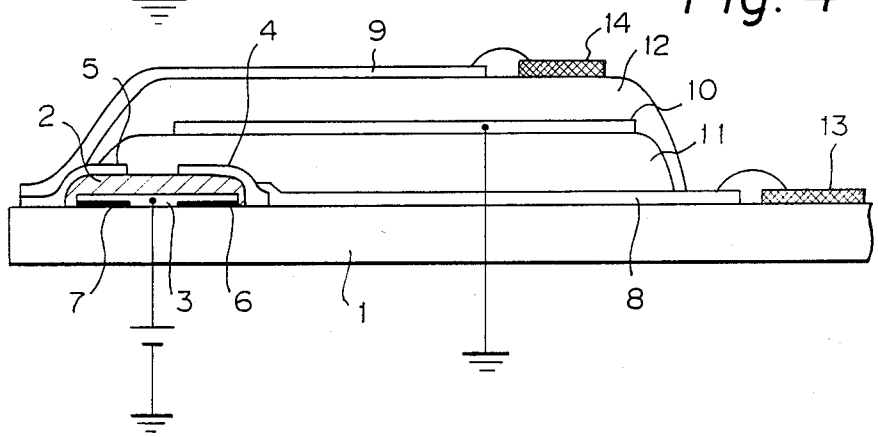
FIG. 4 illustrates a schematic sandwich type structure of a second embodiment of the inventive line photosensor.

FIG. 4 shows a second embodiment in which the sensor elements of the line sensor according to the present invention each are of a sandwich. Detailed description on the respective components of the embodiment of FIG. 4 will be omitted because it is the same as that on the components of FIG. 3.

Figure 5:
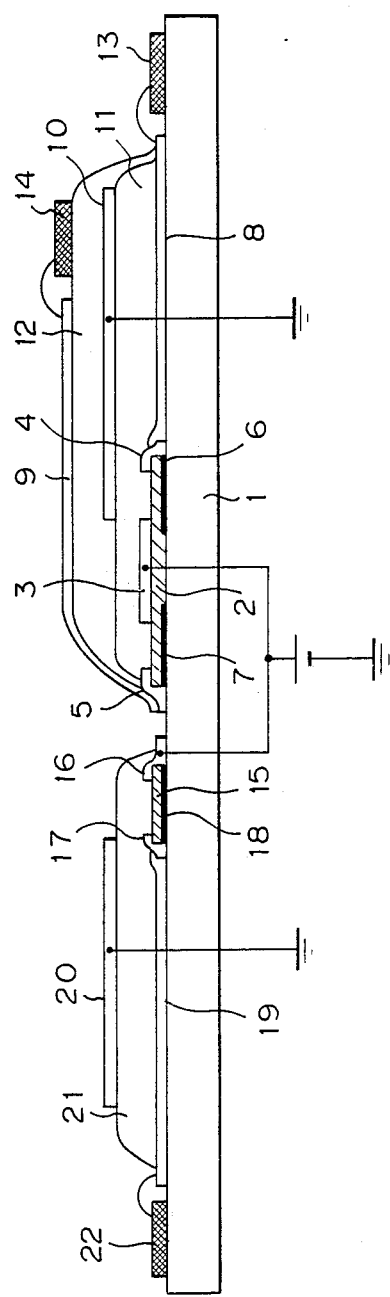
FIG. 5 illustrates a schematic structure of a third embodiment of the inventive line photosensor, showing three rows of sensor elements.

FIG. 5 shows another embodiment of the present invention. In this embodiment, outputs are obtained from three sensor elements thereof. The portion of this embodiment in which the outputs are obtained from two of the three elements has the same structure as the first embodiment of FIG. 3. In the second embodiment, a photoconductor 15 is formed on glass substrate 1, and individual electrodes 16 and 17 are formed on photoconductor 15, individual electrodes 16 being connected to common electrode 3 and individual electrodes 17 connected by output wiring electrodes 19 to corresponding ICs 22. Formed over extract electrodes 19 is a grounding electrode 20 by the medium of insulation layer 21. A filter 18 is formed between a corresponding photoconductor 15 and substrate 1.

The line photosensor having the above structure can read three colors and includes three parallel-arranged arrays, the parallel arrangement of which is difficult according to conventional techniques.

FIG. 6 illustrates a combination of a matrix wiring section and the line photosensor of the first embodiment of the present invention.

FIG. 6(a) is a plan view of the combination, and FIG. 6(b) a cross-sectional view taken along the line B-B'.

In FIGS. 6(a) and 6(b), output electrode 8, connected to one sensor element, is connected to a thin film transistor (TFT) TR1 to obtain the stored photocurrent. Each transistor TR1 is composed of a thin film semiconductor layer 32, source and drain electrodes 31 and 30 attached to semiconductor 32, insulating layer 11 and a gate electrode 33 formed on insulating layer 11. The extract wiring electrode, connected to the other sensor element, is also connected to a thin film transistor TR2 in a similar manner. Transistor TR2 is composed of a thin film semiconductor layer 25, source and drain electrodes 24 and 23, insulating layer 37 and gate electrode 26. Gate electrodes 26 and 33 are wired in common for each of the matrix wiring blocks. Thin film transistors TR1 and TR2 are driven for each block. In the particular embodiment, the number of sensor elements of one block is three, as shown in FIG. 6(a), for simplicity. One matrix circuit is composed of an insulating layer 11, upper conductors 34, a lower conductor 35 formed on glass substrate 1, and a contact hole 36 between the upper and lower conductors. The outputs from the sensor elements at the same order in the respective blocks are connected in common. Another matrix circuit is composed of an insulating layer 37, upper conductors 27 formed on insulating layer 37, lower conductor 28 on insulating layer 12 and a contact hole 29 between upper and lower conductors 27 and 28. The outputs from the sensor elements at the same order in the respective blocks are connected in common. The upper conductors of these matrix circuits are connected to a signal processing circuit, not shown in FIG. 6.

Also, in the particular embodiment, wiring may be made from three sensor elements as in the embodiment of FIG. 5. 5 As described above in detail, according to the present invention, the line photosensor does not require wide spaces for photocurrent storage capacitors and can obtain a signal from each of the sensor elements by suppressing the mutual influence between the respective output conductors. Thus the photosensor has a compact structure in which high-quality image reading is attained.

What is claimed is:

1. A line photosensor comprising:
   a plurality of sensor elements in at least one row on a substrate;
   a plurality of extract wiring electrodes extending from the respective sensor elements, said wiring electrodes being wired in an electrically isolated and laminated manner in which said extract wiring electrodes are laminated so that they hold therebetween a laminated structure including, in this order, a first insulating layer, an intermediate electrode layer formed on said first insulating layer, and a second insulating layer formed on said intermediate electrode layer;
   a first transistor for obtaining a photocurrent stored in one of said plurality of sensor elements, wherein said first transistor includes said first insulating layer and is connected to one of said extract wiring electrodes; and
   a second transistor for obtaining a photocurrent stored in another of said plurality of sensor elements, wherein said second transistor includes a third insulating layer formed on said second insulating layer and is connected to another of said extract wiring electrodes.

2. A photosensor according to claim 1, wherein each sensor element includes a color filter.

3. A photosensor according to claim 1, wherein the respective extract wiring electrodes are electrically connected to a corresponding drive IC.

4. A photosensor according to claim 1, wherein a first capacitor comprises a first one of said extract wiring electrodes, said first insulating layer and said intermediate electrode layer, and a second capacitor comprises a second output electrode, said insulating layer and said intermediate electrode layer.

* * * * *